United States Patent [19]

Sudo et al.

[11] Patent Number: 5,071,236

[45] Date of Patent: Dec. 10, 1991

[54] REPLICA PLATE, PROCESS FOR PRODUCING THE SAME AND PROJECTION TYPE TELEVISION USING THE SAME

[75] Inventors: Ryoichi Sudo, Yokosuka; Chiyoko Iwano, Tokyo; Hiroaki Miwa; Tetsuo Tajima, both of Fujisawa; Hiroyuki Onodera, Yokohama, all of Japan

[73] Assignee: Hitachi, Ltd., Tokyo, Japan

[21] Appl. No.: 496,029

[22] Filed: Mar. 20, 1990

[30] Foreign Application Priority Data

Mar. 20, 1989 [JP] Japan .................................. 1-66101

[51] Int. Cl.⁵ ........................ B29D 11/00; G02B 3/08
[52] U.S. Cl. .................................. 359/742; 359/900
[58] Field of Search ............... 350/452, 417, 409, 413, 350/432

[56] References Cited

U.S. PATENT DOCUMENTS

| | | |
|---|---|---|
| 4,440,586 | 4/1984 | Lippits et al. |
| 4,737,447 | 4/1988 | Suzuki et al. ........................ 350/417 |
| 4,959,431 | 9/1990 | Watanabe et al. ................... 350/409 |

*Primary Examiner*—Bruce Y. Arnold
*Assistant Examiner*—Rebecca D. Gass
*Attorney, Agent, or Firm*—Antonelli, Terry, Stout & Kraus

[57] ABSTRACT

This invention relates to a replica plate having a transparent plastic substrate and a photo-cured resin, and a projection type television using the replica plate. An adhesive layer comprising an acrylic or methacrylic compound is provided between a transparent plastic plate and a replica-forming photo-curable resin, whereby it is possible to enhance the adhesion between the surface of the transparent plastic plate and the photo-cured resin, and to produce a replica plate having excellent optical characteristics, good replicating properties and high reliability. The adhesive layer can be provided (1) by coating a layer containing the acrylic or methacrylic compound on the plastic plate, the compound infiltrating into the plate, or (2) by incorporating the acrylic or methacrylic compound into the photo-curable resin, the compound infiltrating therefrom into the plate; in this latter technique, the plate coated with the resin should be heated. This invention has contribution to enhancement of the performance of projection type screens for television, optical parts such as lenses, and products associated with optical disks.

21 Claims, 7 Drawing Sheets

REPLICA PLATE, PROCESS FOR PRODUCING THE SAME AND PROJECTION TYPE TELEVISION USING THE SAME

BACKGROUND OF THE INVENTION

This invention relates to a replica plate comprising a transparent plastic substrate and a photo-cured resin, a process for producing the replica plate, and a projection type television including a projection type screen using the replica plate.

In the manufacture of projection type screens for television, general Fresnel lenses, general lenses, optical disk substrates, diffraction gratings or the like, it has been a common practice to make a multiplicity of replica plates by repeating transfer from a matrix having a surface provided with recessed and projected portions or with a certain curved surface.

Figure 2:
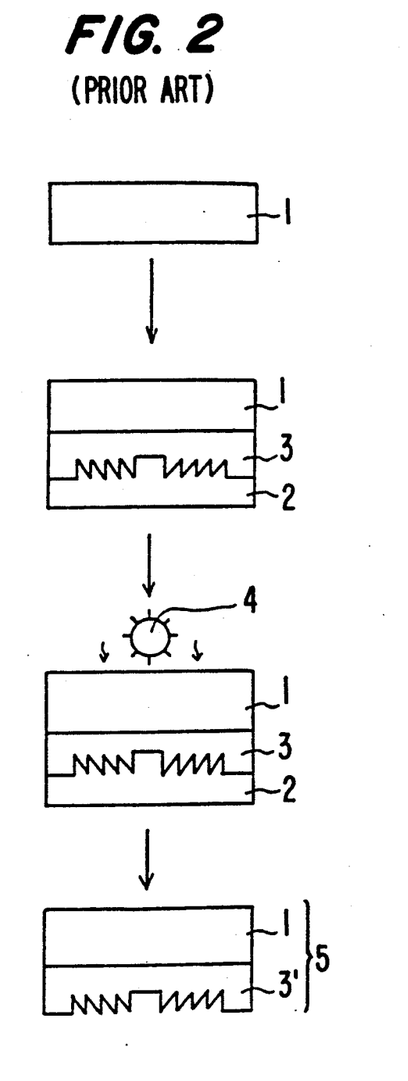
FIG. 2 is a process drawing showing the main steps of the production process of a replica plate according to the prior art.

For the production of the replica plate, there has hitherto been known a method as shown in FIG. 2. In this method, a replica-forming photo-curable resin 3 is placed between a transparent plastic plate 1 and a matrix 2 formed of an organic or inorganic material, the resin 3 is cured by irradiation with energy rays 4, to form photo-cured resin 3', and the matrix 2 is released to obtain a replica plate 5.

According to the conventional method shown in FIG. 2, which is disclosed in Japanese Patent Laid-open No. 177215/86, however, it is difficult to maintain a high level of adhesion between the transparent plastic plate 1 and the photo-cured resin 3'. Thus, there have been the cases of delamination occurring between the transparent plastic plate 1 and the photo-cured resin 3' upon the release of the replica plate 5 from the matrix 2, leaving the photo-cured resin 3' on the matrix 2. Even if the replica plate 5 is released favorably, delamination might occur between the transparent plastic plate 1 and the photo-cured resin 3' during long-time use of the replica plate.

SUMMARY OF THE INVENTION

It is an object of this invention to provide a replica plate free from the above-mentioned drawbacks of the prior art, which replica plate is optically transparent and has excellent replicating properties as well as excellent lifetime characteristics; a process for producing the replica plate; and products, such as a projection type television, using the replica plate.

A characteristic feature of this invention is to provide an adhesive layer comprising an acrylic or methacrylic compound between a transparent plastic plate and a replica-forming photo-curable resin. For realizing this feature of the invention, the following two processes are effective. Such processes for providing the adhesive layer are illustrative and not limiting.

Figure 1:
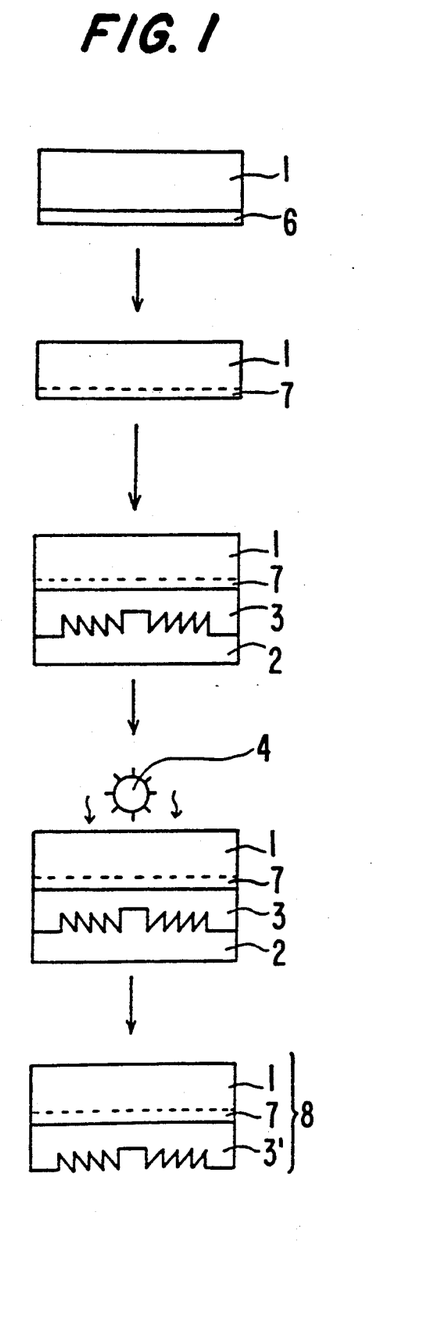
FIG. 1 is a process drawing showing the main steps of a production process of a replica plate according to a first method for this invention.

In a first process, as shown in FIG. 1, a surface of a transparent plastic plate 1 is preliminarily coated with an acrylic or methacrylic compound (e.g., a liquid acrylic or methacrylic compound) as an adhesion promotor 6, which infiltrates into a surface layer of the plastic plate to form an infiltrated layer 7. The infiltrated layer 7 is a swollen layer formed by the acrylic or methacrylic compound and a surface layer of the transparent plastic plate, with the acrylic or methacrylic compound and the material of the transparent plastic plate coexisting in the infiltrated layer 7.

Next, an acrylic or methacrylic replica-forming photo-curable resin 3 is placed between the transparent plastic plate 1 provided with the infiltrated layer 7 and a matrix 2. The resin 3 is cured by energy rays 4, to form photo-cured layer 3', and the matrix 2 is removed to obtain a replica plate 8.

Because the surface layer of the transparent plastic plate 1 is preliminarily swollen with the adhesion promotor 6, in the infiltrated layer 7, in this process, intermingling of the replica-forming photo-curable resin 3 and the material of the transparent plastic plate is promoted, resulting in better adhesion between the plastic plate 1 and the photo-cured resin 3'.

Figure 3:
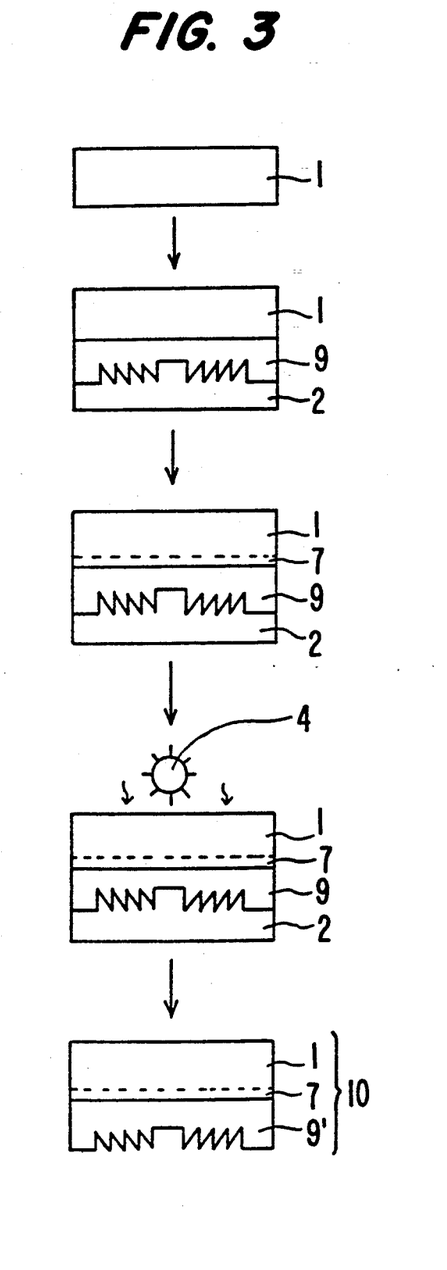
FIG. 3 is a process drawing showing the main steps of a second production process of the replica plate according to this invention.

In a second method, as shown in FIG. 3, a photo-curable resin 9, having added thereto, as an adhesion promotor, an acrylic or methacrylic compound (e.g. liquid acrylic or methacrylic compound) capable of infiltrating into the transparent plastic plate, is placed between the plastic plate 1 and a matrix 2, and the adhesion promotor infiltrates into the plastic plate to form an infiltrated layer 7.

The infiltration of the adhesion promotor into the transparent plastic takes place slowly in this second method, and hence requires a longer time, in the presence of the photo-curable resin. In this second method, therefore, the transparent plastic 1 and the photo-curable resin 9 with the adhesion promotor added thereto are heated in contact with each other. The heating is accomplished by warming the transparent plastic plate 1 or the matrix 2 or the entire assembly as a whole, by light or heat.

After formation of the infiltrated layer 7, the photo-curable resin is cured in the same manner as in the first process, to provide photo-cured resin 9', and to form a replica plate 10.

Figure 10:
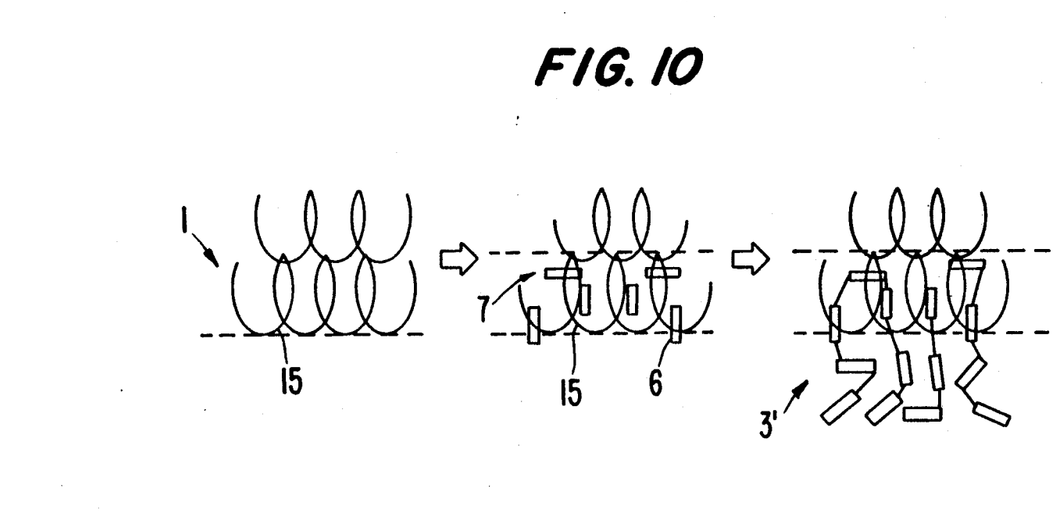
FIG. 10 illustrates schematically the adhesion achieved between the replica-forming cured resin and the transparent plastic plate, through use of the adhesion promotor.

In each of the two above-described illustrative examples of the present invention, the adhesion promotor infiltrates the transparent plastic plate to form infiltrated layer 7, with the infiltrated layer 7 achieving improved adhesion between the transparent plastic plate 1 and the photo-cured resin. While applicants do not intend to be limited to a specific theory, the technique by which the adhesion promotor improves adhesion between the transparent plastic plate 1 and the photo-cured resin can be seen in the following, together with FIG. 10. The transparent plastic plate 1 is comprised of a high molecular weight resin 15. Upon providing the acrylic or methacrylic compound 6 on the transparent plastic plate 1, the compound 6 infiltrates into a surface layer of the transparent plastic plate 1, to form infiltrated layer 7, with resin 15 of the transparent plastic plate 1 coexisting in the infiltrated layer 7 with the compound 6 (see the central diagram of FIG. 10). After the replica-forming photo-curable resin (e.g., photo-curable resin 3) contacts the surface of the infiltrated layer 7, and with photo-curing of the photo-curable resin 3, the resin 3 polymerizes with the acrylic or methacrylic compound 6, to thereby tie up with the resin 15 of the transparent plastic plate (see the right-hand diagram of FIG. 10). Thus, adhesion between the photo-cured resin 3' and the transparent plastic plate is ensured.

In the second method, the matrix need not be provided adjacent the mixture of adhesion promotor and photo-curable resin at the time of forming the infiltrated layer 7. For example, the mixture of adhesion promotor and photo-curable resin can be formed on the transparent plastic plate and thereafter heated so as to form the infiltrated layer. Thereafter, the matrix 2 is contacted with photo-curable resin and the photo-curable resin is then cured, as in the first process.

In the production of the replica plate according to this invention, the transparent plastic plate to be used is not particularly limited. What is necessary, for materials for the transparent plastic plate, is that the plate can act for forming the replica plate and that the acrylic or methacrylic compound can infiltrate into a surface layer of the plate and form an infiltrated layer 7 (a swollen layer). The materials which can be used for the transparent plastic plates include (but are not limited to), for example, the following:

Acrylic resins such as polymethyl methacrylate, polyethyl methacrylate, etc., polystyrene, methyl methacrylate-styrene copolymers, styrene-acrylonitrile, copolymers, styrene-butadiene copolymers, styrene-isoprene copolymers, polycarbonates, cellulose derivatives such as cellulose acetate, cellulose acetate butyrate, etc., and polyvinyl chloride.

Among these materials, generally used are acrylic resins, polystyrene, methyl-methacrylate and styrene copolymers, polycarbonates, and cellulose derivatives.

The adhesion promotor comprising the acrylic or methacrylic compound to be infiltrated into the surface of the transparent plastic plate is preferably a substance which swells the surface of the transparent plastic plate upon making contact with the plastic plate and which is compatible with the replica-forming photo-curable resin to be subsequently brought into contact therewith, and the adhesion promotor is preferably a liquid substance having a boiling point of not lower than 130° C. If the boiling point is lower than 130° C., the adhesion promotor is easily evaporated when applied to the transparent plastic. The evaporation makes it impossible to obtain a satisfactory adhesion-promoting effect, and is accompanied by a lot of odor, which lowers the operability.

As the adhesion promotor, for instance, the following may be used:

Benzyl acrylate, benzyl methacrylate, phenyl acrylate, phenyl methacrylate, 2-phenoxyethyl acrylate, 2-phenoxyethyl methacrylate, 2-phenoxypropyl acrylate, 2-phenoxypropyl methacrylate, neopentyl glycol diacrylate, neopentyl glycol dimethacrylate, 1,6-hexanediol diacrylate, and 1,6-hexanediol dimethacrylate.

Among these compounds, generally used are benzyl acrylate and methacrylate, neopentyl glycol diacrylate and dimethacrylate, and 1,6-hexanediol diacrylate and dimethacrylate.

The adhesion promotor used in the first-named process of this invention may be the acrylic or methacrylic compound alone, or the acrylic or methacrylic compound may be used with a general photopolymerization initiator added thereto, e.g., in an amount of 0.2 to 5 parts by weight per 100 parts by weight of the acrylic or methacrylic compound.

As the photopolymerization initiator, for instance, the following may be used:

Benzils such as benzil, methyl o-benzoate, etc., benzoins such as benzoin, benzoin ethyl ether, benzoin isopropyl ether, benzoin isobutyl ether, etc., benzophenones such as benzophenone, 4-methoxybenzophenone, etc., acetophenones such as acetophenone, 2-2-diethoxyacetophenone, etc., thioxanthones such as 2-chlorothioxanthone, 2-methylthioxanthone, etc., anthraquinones such as 2-ethylanthraquinone, 2-methylanthraquinone, etc., benzil methyl ketal, 1-hydroxycyclohexyl phenyl ketone, 2-hydroxy-2-methyl-1-phenylpropan-1-one, 1-(4-isopropylphenyl)-2-hydroxy-2-methylpropan-1-one, etc., at least one of these compounds being used either singly or in combination.

Application of the adhesion promoting composition according to this invention to the surface of the transparent plastic plate may be carried out by using a conventionally known coating method, for instance, spin coating, spray coating, dip coating or offset printing.

The acrylic and methacrylic replica-forming photo-curable resins are each an admixture of at least one monomer (compound), having an acryl group and/or a methacryl group in the molecule thereof with a photopolymerization initiator. When the admixture is irradiated with energy rays, the photopolymerization initiator reacts to generate radicals, which induce radical polymerization of the acryl groups and/or methacryl groups in the monomers, thereby yielding a crosslinkable polymer.

The acrylic or methacrylic replica-forming photo-curable resin is not particularly limited as to composition, insofar as the cured resin is capable of easy release from a matrix having a surface provided with recessed and projected portions, after photo-curing. Such types of photo-curable resins are disclosed, for instance, in Japanese Patent Application Laid-open (KOKAI) Nos. 53-86756 (1978) (and its corresponding U.S. Pat. No., 4,440,586) and 56-127946 (1981), the contents of the two Japanese Laid-Open applications and of the U.S. patent being incorporated herein by reference in their entirety.

Generally, the acrylic or methacrylic photo-curable resin includes at least one acrylic or methacrylic group in the acrylic and/or methacrylic compound. Desirably, 100 parts by weight of the compound are mixed with 0.2-5 parts by weight of a photo-polymerization initiator which can initiate polymerization under 25° C., such that the photo-curable resin is cured when exposed to light in forming the replica plate 8.

Some examples of the compounds having an acrylic or methacrylic group follows. The listed compounds are illustrative, and not limiting.

(1) Monofunctional compounds:

Ethylacrylate, ethylmethacrylate, n-butylacrylate, n-butylmethacrylate, iso-butylacrylate, iso-butylmethacrylate, 2-etylhexylacrylate, n-hexylmethacrylate, n-octylacrylate, n-octylmethacrylate, 2-ethylhexylacrylate, 2-ethylhexylmethacrylate, decylacrylate, decylmethacrylate, tridecylacrylate, tridecylmethacrylate, octadecylacrylate, octadecylmethacrylate, isobornylacrylate, isobornylmethacrylate, adamantylacrylate, and adamantylmethacrylate;

(2) Difunctional compounds:

1,3-butanedioldiacrylate, 1,3-butanedioldimethacrylate, neopentylglycoldiacrylate, neopentylglycoldimethacrylate, 1,6-hexanedioldiacrylate, 1,6-hexanedioldimethacrylate, 1,10-decanedioldiacrylate, 1,10-decanedioldimethacrylate, diethyleneglycoldiacrylate, diethyleneglycoldimethacrylate, triethyleneglylcoldiacrylate, triethyleneglycoldimethacrylate, tetraethyleneglycoldiacrylate, tetraethyleneglycoldimethacrylate, polyethyleneglycoldiacrylate, polyethyleneglycoldimethacrylate, polypropyleneglycoldiacrylate, polypropyleneglycoldimethacrylate, polyesterpolyoldiacrylates, polyesterpolyoldimethacrylates, polyurethanepolyoldiacrylates, polyurethanepolyoldimethacrylates, epoxyacrylate, epoxymethacrylate, 2,2-bis (4-hydroxypolyethoxyphenyl) propanediacrylates, 2, 2-bis (4-hydroxypolyethoxyphenyl) propanedimethacrylates; and (3) Polyfunctional compounds:

Trimethylolpropanetriacrylate, trimethylolpropanetrimethacrylate, pentaerythritoltetraacrylate, pentaerythritoltetramethacrylate.

The above-listed compounds can be used individually, or mixed at least two together.

Examples of photo-polymerization initiators, which can be mixed with the acrylic or methacrylic compound include the following illustrative initiators. The initiators are not limited to the listed compounds.

Benzils such as benzil and methyl-o-benzoate; benzoins such as benzoin, benzoin ethyl ether, benzoin isopropyl ether, and benzoin isobutyl ether; benzophenones such as benzophenone, 4-methoxybenzophenone; acetophenones such as acetophenone, and 2,2-diethoxyacetophenone; thioxanthones such as 2-chlorothioxanthone and 2-methylthioxanthone; anthraquinones such as 2-ethylanthraquinone and 2-methylanthraquinone; benzil methyl ketal; 1-hydroxycyclohexyl phenyl ketone; 2-hydroxy-2-methyl-1-phenylpropan-1-one; and 1-(4-isopropylphenyl)-2-hydroxy-2-methylpropan-1-one.

The points on which this invention is based will now be described. Generally, the constituent substances in a photo-curable resin hardly swell a transparent plastic, and it is difficult to provide the photo-cured resin with satisfactory adhesiveness to the transparent plastic plate. In addition, even when the photo-curable resin contains a constituent substance capable of swelling the transparent plastic, adhesion of the resin to the plastic requires a long contact time, which markedly lowers the working efficiency and renders the use of the resin impractical. On the other hand, an attempt was made to soften the surface layer of the transparent plastic plate by immersing the plastic plate in a solvent, but the attempt resulted in mechanical deformation or opacification of the transparent plastic plate. Furthermore, the solvent was left on the surface of the plastic plate, leading to a high possibility of abnormal roughening of the replica surface, and the bond strength between the plastic plate and the replica-forming photo-curable resin was not improved to a high level.

To the contrary, the use of the adhesion composition according to the present invention enables swelling of, e.g., a surface layer of the transparent plastic to be easily achieved. Moreover, the interaction between the transparent plastic plate and the acrylic or methacrylic compound can be achieved in an extremely short time.

In this invention, transparent plastics, and acrylic and methacrylic compounds capable of infiltrating into the plastic of the transparent plastic plate relatively favorably, have been found out. Based on the finding, in the first-named process of this invention the acrylic or methacrylic compound is applied as an adhesion promotor to the transparent plastic plate, and is left to stand, whereby the adhesion promotor is infiltrated sufficiently into the plastic plate. In the second-named process, a photo-curable resin with the adhesion promotor added thereto is left to stand or is heated in contact with the transparent plastic plate, whereby the adhesion promotor is infiltrated sufficiently into the plastic plate. The transparent plastic thus treated shows a markedly enhanced property for adhesion to general acrylic and methacrylic replica-forming photo-curable resins.

As seen in the foregoing, the acrylic or methacrylic compound causes a swollen surface layer of the transparent plastic plate, infiltrating a surface layer of the transparent plastic plate (infiltrated layer 7). The acrylic or methacrylic compound and the substances of the transparent plate coexist, the transparent plate swelling. The replica-forming photo-curable resin can tightly adhere to the transparent plastic plate by means of the infiltrated layer 7.

Figure 8:
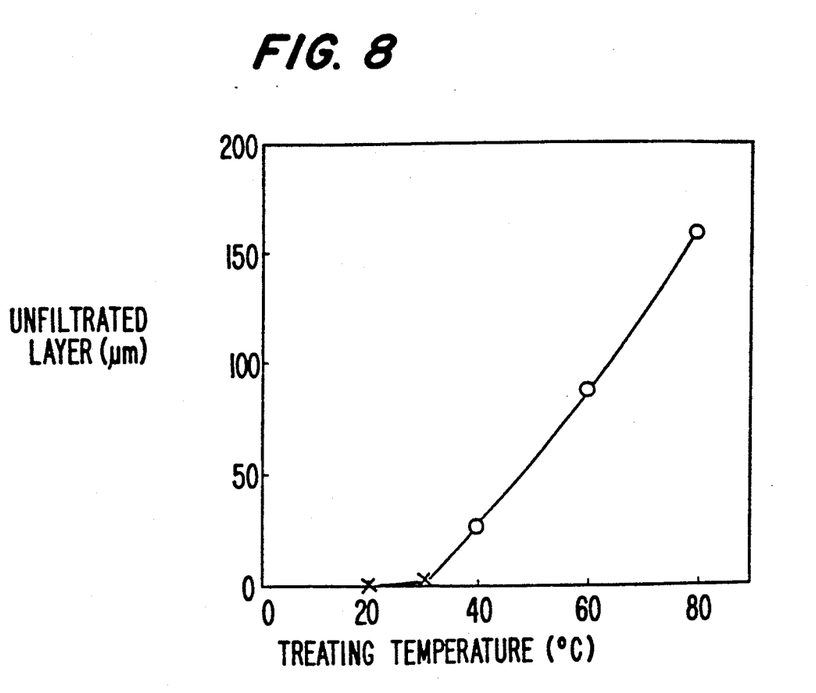

Preferably, the infiltrated layer has a thickness of 5–170 μm (see FIG. 8). Where the infiltrated layer has a thickness of less than 5 μm, the surface uniformity is disadvantageously bad, so that release between the transparent plastic plate and the photo-cured resin can occur. Where the thickness of the infiltrated layer is greater than 170 μm, the mechanical strength of the layer could become disadvantageously low.

In the first method described above, the layer of the adhesion promotor preferably has a thickness of 0.5 to 30 μm, more preferably 1 to 20 μm. Where the thickness of the layer of adhesion promotor is less than 0.5 μm, it is very difficult to form an infiltrated layer that is thick enough. Where the thickness of the layer of adhesion promotor is greater than 30 μm, uniformity of the thickness of the layer is difficult to maintain because the liquid of the adhesion promotor flows over the transparent plastic plate.

Figure 6:
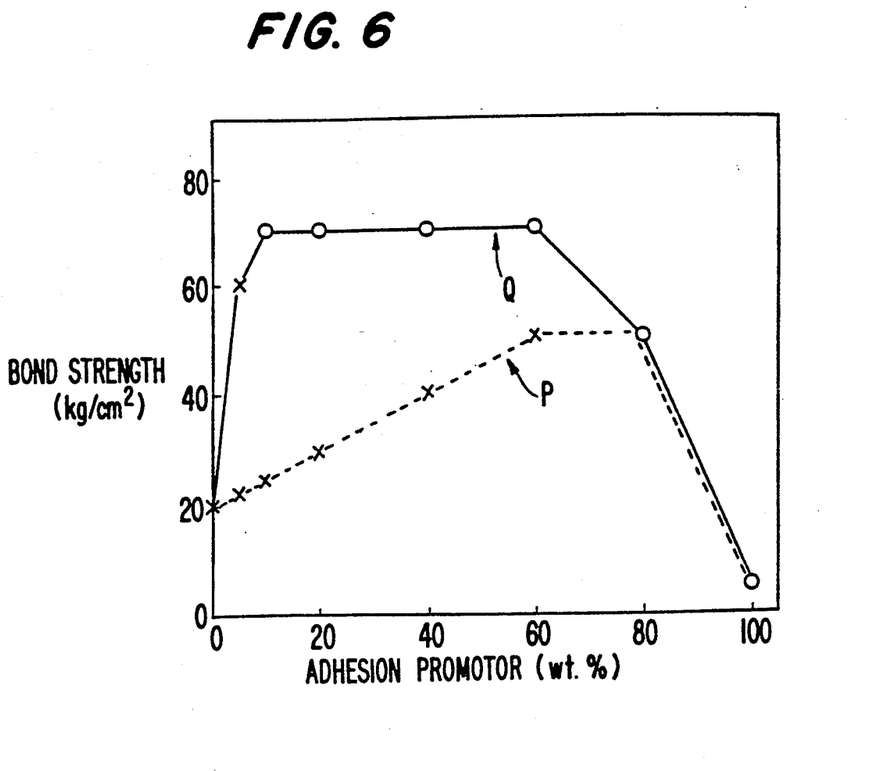

In the second method described above, the preferred range of adhesion promotor mixed in the photo-curable resin is 10 wt % to 60 wt %, as shown in FIG. 6. Moreover, in this second method the mixture of adhesion promotor and photo-curable resin, in contact with the transparent plastic plate is desirably heated at a temperature of 40°–100° C., preferably 50°–80° C., in order to form the infiltrated layer 7.

DETAILED DESCRIPTION OF THE PREFERRED EMBODIMENTS

Working examples of this invention will now be described in detail below. These examples are illustrative and not limiting of the present invention.

EXAMPLE 1

As an adhesion promotor, a mixture of 98% by weight of benzyl methacrylate and 2% by weight of 1-hydroxycyclohexyl phenyl ketone, which is a photopolymerization initiator, was prepared.

As an acrylic and methacrylic replica-forming photocurable resin, the following composition was prepared:

88% by weight

10% by weight
Benzyl methacrylate

2% by weight
1-(4-Isopropylphenyl)-2-hydroxy-2-methylpropan-1-one

Transparent plates (20×60 mm) of a methyl methacrylate-styrene copolymer (styrene 60 wt. %), 5 mm in thickness, were prepared. Two of the transparent plates were laminated with each other by use of the replica-forming photo-curable resin prepared as above (adhesion area: 1 cm$^2$, thickness of the layer of the photo-curable resin: 200 μm).

Figure 4:
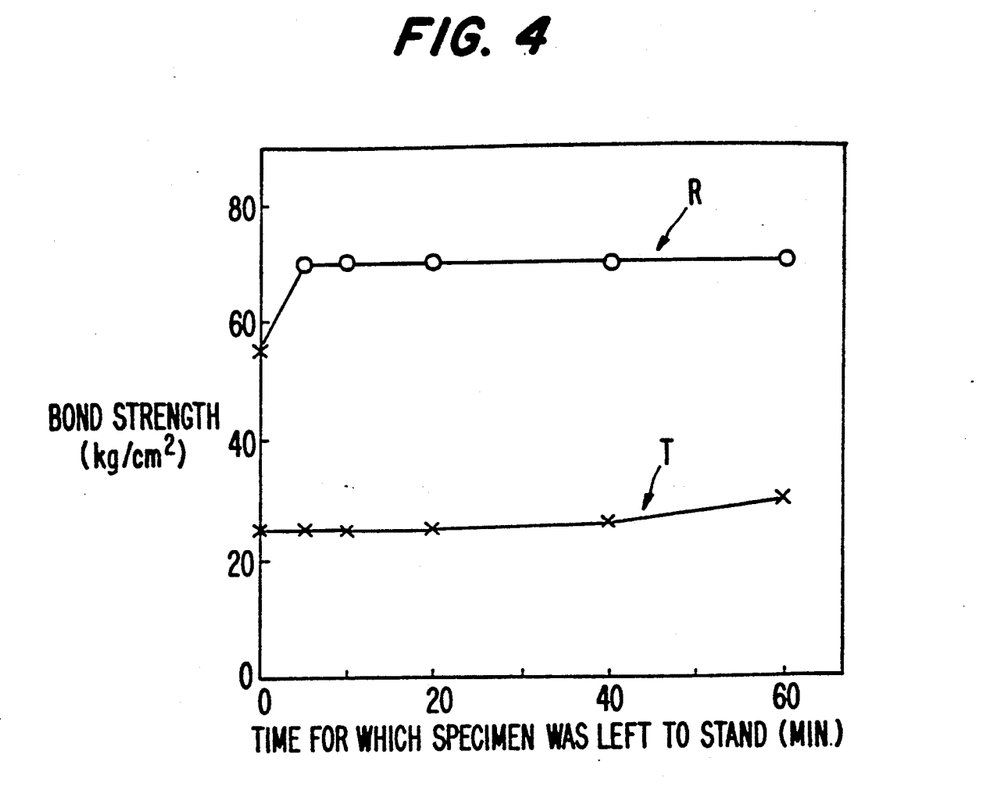
FIGS. 4, 6 and 7 are each a graph showing the relationship between various processing conditions using an adhesion promotor according to this invention and the bond strength between a transparent plastic plate and a photo-cured resin.

After applying the replica-forming photo-curable resin to transparent plate, the resin in the liquid state was left to stand at room temperature (20° C.) for a predetermined period of time. Then, the resin was photo-cured by use of a high pressure mercury vapor lamp (30-second irradiation with a light intensity 150 mW/cm$^2$ at a wavelength of 365 nm) to produce an adhesion test piece. The relationship between the bond strength of the specimen and the period of time for which the resin was left to stand is shown in FIG. 4 (see curve T in FIG. 4).

Figure 5:
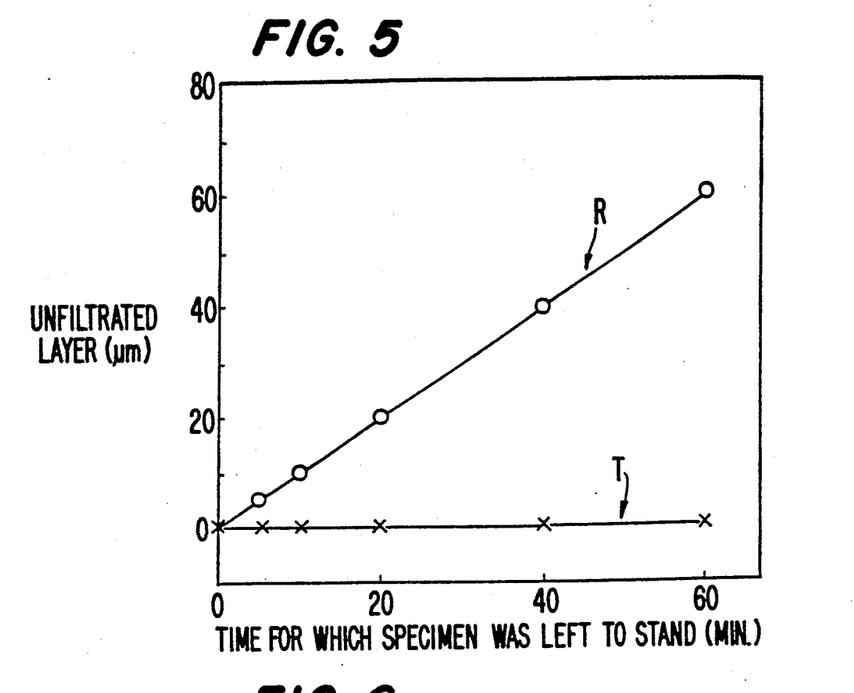
FIGS. 5 and 8 are each a graph illustrating a thickness of the layer infiltrated with the adhesion promotor according to this invention.

The adhesion test piece was cut perpendicularly to the adhered surface, and the cross-section was polished. The polished cross-section was observed under a microscope to see if the replica-forming photo-curable resin had been infiltrated into the transparent plate. As shown in FIG. 5 (see curve T in FIG. 5), there was substantially no infiltrated layer, and it was found that the replica-forming photo-curable resin does not penetrate into the transparent plate at a normal temperature.

Separately, the adhesion promotor previously prepared was applied to the above-mentioned transparent plates in a thickness of about 1 μm by a spraying method, and was left to stand as it was at normal temperature (20° C.) for a predetermined period of time. Two plates thus treated were laminated with each other by the replica-forming photo-curable resin in the same procedure as above-mentioned, followed immediately by photo-curing to produce an adhesion test piece. The relationship between the bond strength of the specimen and the period of time for which the resin was left to stand is shown in FIG. 4 (see curve R in FIG. 4).

Further, the adhesion test piece was cut perpendicularly to the adhered surface, and the cross-section was polished. Microscopic observation of the polished cross section revealed that the adhesion promotor had been infiltrated into the transparent plate, as shown in FIG. 5 (see curve R in FIG. 5).

In FIGS. 4 and 5, the measurement points marked X show that the adhesion test piece was delaminated at the interface of the transparent plate and the replica-forming photo-cured resin, whereas the measurement points marked O show the cohesive failure of the transparent plate or photo-cured resin itself. The system in which the adhesion promotor was preliminarily infiltrated into the transparent plate (represented by the curve R in FIGS. 4 and 5) showed a markedly enhanced bond strength, as compared with the system in which the adhesion promotor was not applied (represented by the curve T in FIGS. 4 and 5).

Meanwhile, the bond strength of the replica-forming photo-curable resin of the type used here and matrix materials such as nickel, brass, etc. was 10 to 20 kg/cm$^2$.

The bond strength between the transparent plate infiltrated with the adhesion promotor and the replica-forming photo-cured resin was sufficiently higher than the bond strength between the matrix material and the photo-cured resin (by at least about 50 kg/cm$^2$). On the other hand, the bond strength between the transparent plate not coated with the adhesion promotor and the replica-forming photo-cured resin was little different from the bond strength between the matrix material and the photo-cured resin.

EXAMPLE 2

As illustrated in FIG. 1, a transparent plate 1 of a methyl methacrylate-styrene copolymer, 970×740×3 mm, was coated with the adhesive promotor 6 as shown in EXAMPLE 1 in a thickness of about 1 μm by a spraying method, and was left to stand as it is for 10 minutes at normal temperature (20° C.) to infiltrate the adhesion promotor into the transparent plate, thereby forming an infiltrated layer 7 to a depth of about 10 μm.

The replica-forming photo-curable resin 3 shown in EXAMPLE 1 was placed between the transparent plate and a brass-made Fresnel pattern forming matrix 2 equal in area to the transparent plate. By use of a high pressure mercury vapor lamp 4 disposed on the side of the transparent plate, irradiation with light was conducted (for 30 minutes with a light intensity of 50 mW/cm$^2$ at a wavelength of 365 nm) to cure simultaneously the infiltrated layer 7 and the replica-forming photo-curable resin. Then, the matrix was released, to obtain a Fresnel plate as the replica plate 8.

On the other hand, as shown in FIG. 2, a replica plate 5 was produced without using the adhesion promotor. In this case, the transparent plate 1 and the photo-cured resin 3' were delaminated in part, and the photo-cured resin 3' was partially left on the matrix 2.

EXAMPLE 3

Replica-forming photo-curable resins containing various constituent substances, designated A to D in TABLE 1, were prepared.

TABLE 1

| Classification | Constituent substance | Replica-forming photo-curable resin | | | | | | | | | | | |
|---|---|---|---|---|---|---|---|---|---|---|---|---|---|
| | | A | B | C | D | E | F | G | H | I | J | K | L |
| General | CH$_2$=CH—C—O(CH$_2$—CH$_2$—O)$_2$ —[bisphenol A]— (O—CH$_2$—CH$_2$)$_2$O—C—CH=CH$_2$ | 98 | 78 | | | 78 | 78 | 78 | 78 | | | | |
| Acrylate | CH$_2$=CH—C—O—CH$_2$—CH—CH$_2$—O—[bisphenol A]—O—CH$_2$—CH—CH$_2$—O—C—CH=CH$_2$ (OH groups) | | | 68 | | | | | | 68 | 68 | 68 | |
| | CH$_2$=CH—C—O—CH$_2$—CH$_2$—O—C—N—[dimethylcyclohexyl]—CH$_2$—N—C—O—CH$_2$—CH$_2$—O—C—CH=CH$_2$ | | | | 48 | | | | | | | | |
| | CH$_2$=C—C—O—CH$_2$—[decalin]—CH$_2$—O—C—C=CH$_2$ (CH$_3$) | | | | | | | | | | | | 78 |
| Adhesion | Benzyl methacrylate | 20 | | 30 | | | | | | | | | 20 |
| | Phenyl methacrylate | | | | | 20 | | | | | | | |
| | 2-Phenoxyethyl acrylate | | | | | | 20 | | | 30 | | | |
| | 2-Phenoxypropyl acrylate | | | | | | | 20 | | | 30 | | |
| Promotor | 1,6-Hexanediol dimethacrylate | | | | 50 | | | | 20 | | | | |
| Photopolymerization Initiator | 1-(4-Isopropylphenyl)-2-hydroxy-2-methylpropan-1-one | 2 | 2 | 2 | 2 | 2 | 2 | 2 | 2 | 2 | 2 | 2 | 2 |

Transparent plastic plates, adhesion promotors and replica-forming photo-curable resins were selected as shown in TABLE 2, and replica plates were formed in the same procedure as in EXAMPLE 2.

transparent plastic plate and the photo-cured resin was insufficient, namely, 30 kg/cm² or below. Thus, partial delamination between the transparent plastic plate and the replica-forming photo-cured resin took place in

TABLE 2

| Classification | No. | Transparent Plastic Plate | Adhesion Promotor* Constituent Substance | Adhesion Promotor* Treating Condition | Replica-forming Photocurable Resin | Bond** Strength (kg/cm²) | Condition of Replica |
|---|---|---|---|---|---|---|---|
| Comparative Example | 1-1 | Methyl methacrylate/styrene copolymer (styrene: 40 wt. %) | None | None | A | 20 | bad |
| | 2 | Methyl methacrylate/styrene copolymer (styrene: 40 wt. %) | " | " | B | 30 | " |
| | 3 | Methyl methacrylate/styrene copolymer (styrene: 40 wt. %) | " | " | C | 15 | " |
| | 4 | Methyl methacrylate/styrene copolymer (styrene: 40 wt. %) | " | " | D | 25 | " |
| | 5 | Polymethyl methacrylate | " | " | A | 25 | " |
| | 6 | Polystyrene | " | " | A | 20 | " |
| | 7 | Polycarbonate | " | " | A | 25 | " |
| | 8 | Cellulose diacetate | " | " | A | 15 | " |
| Example | 1-1 | Methyl methacrylate-styrene copolymer (styrene: 40 wt. %) | Benzyl methacrylate | 25° C., 5 min | A | 70 or above | normal |
| | 2 | Methyl methacrylate-styrene copolymer (styrene: 40 wt. %) | Benzyl methacrylate | " | B | 70 or above | " |
| | 3 | Methyl methacrylate-styrene copolymer (styrene: 40 wt. %) | Benzyl methacrylate | " | C | 70 or above | " |
| | 4 | Methyl methacrylate-styrene copolymer (styrene: 40 wt. %) | Benzyl methacrylate | " | D | 70 or above | " |
| | 5 | Polymethyl methacrylate | 2-Phenoxyethyl acrylate | 25° C., 10 min | A | 70 or above | " |
| | 6 | Polystyrene | Phenyl methacrylate | 25° C., 5 min | A | 70 or above | " |
| | 7 | Polycarbonate | 2-Phenoxypropyl acrylate | 25° C., 10 min | A | 70 or above | " |
| | 8 | " | 1,6-Hexanediol diacrylate | 25° C., 10 min | A | 70 or above | " |
| | 9 | Cellulose diacetate | Neopentyl glycol dimethacrylate | 25° C., 5 min | A | 70 or above | " |
| | 10 | Methyl methacrylate/styrene copolymer (styrene: 40 wt. %) | Benzyl methacrylate | 25° C., 5 min | B | 70 or above | " |
| | 11 | Polymethyl methacrylate | 2-Phenoxyethyl acrylate | 25° C., 10 min | A | 70 or above | " |

Notes:
*The amount of photopolymerization initiator in adhesion promotor. Examples 1 to 9: 2 wt. %, Examples 10 and 11: 0 wt. %
**Bond strength between transparent plastic plate and replica-forming photo-curable resin.

In each of EXAMPLES 1-1 to 1-11, the bond strength between the transparent plastic plate and the replica-forming photo-curable resin was not less than 70 kg/cm², and normal replica plates were obtained.

On the other hand, in COMPARATIVE EXAMPLES 1-1 to 1-8 in which the transparent plastic plates were not coated with the adhesion promotor, the replica plates obtained were all rejectable. In each of the rejectable replica plates, the bond strength between the COMPARATIVE EXAMPLES 1-1, 1-2 and 1-4 to 1-7, whereas adhesion of the replica-forming photo-cured resin to the matrix occurred in COMPARATIVE EXAMPLES 1-3 and 1-8. Accordingly, a normal replica plate was not obtained in any of COMPARATIVE EXAMPLES.

EXAMPLE 4

The following acrylic oligomer and benzyl methacrylate as an adhesion promotor were mixed in a predetermined ratio, and 1-(4-isopropylphenyl)-2-hydroxy-2-methylpropan-1-one as a photopolymerization initiator was added to the mixture in an amount of 2% by weight to prepare a photo-curable resin.

The photo-curable resin was used for the lamination of two transparent plates the same as those used in EXAMPLE 1 (adhesion area: 1 cm$^2$, thickness of photo-curable resin layer: 200 μm).

After lamination, one group (p) of the laminates was left to stand as they were at normal temperature (20° C.) for 10 minutes, whereas the other group (Q) of the laminates was immediately brought to a temperature of 60° C. and left to stand at that temperature for 10 minutes. Then, both groups of the laminates were subjected to photo-curing of the photo-curable resin by use of a high pressure mercury vapor lamp (30-second irradiation at a light intensity of 150 mW/cm$^2$ at a wavelength of 365 nm) to produce adhesion test pieces.

The results of tensile tests on the test pieces at 20° C. are shown in FIG. 6. It is seen from the figure that the bond strength between the transparent plate and the photo-cured resin was enhanced by the addition of the adhesion promotor to the resin. The test piece (P) obtained without the heating treatment showed interfacial separation (marked X) between the transparent plate and the photo-cured resin, and the bond strength was at most 50 kg/cm$^2$, the value being below a target value at least 70 kg/cm$^2$. When the amount of the adhesion promotor added is larger, the curability of the photo-curable resin is poor, and complete cure of the resin is not achieved. Therefore, it is desirable that the amount of the adhesion promotor be not more than 70% by weight, and with such an amount of addition it is difficult to obtain a practical level of bond strength in the system (P) not using the heating treatment.

On the other hand, in the system (Q) using the heating treatment, the infiltration of the adhesion promotor into the transparent plate is accelerated. With an addition of the adhesion promotor in an amount of 10 to 60% by weight, therefore, the bond strength obtained is so high (70 kg/cm$^2$) that cohesive failure (marked O) of the transparent plate or the photo-cured resin occurs at the time of the adhesion test, the bond strength being at a practical level.

EXAMPLE 5

A photo-curable resin containing 30% by weight of the adhesion promotor benzyl methacrylate used in EXAMPLE 4 was used for lamination of two transparent plates the same as those in EXAMPLE 1. The effect of the heat treatment before photo-curing on the bond strength between the transparent plate and the photo-cured resin was investigated.

Figure 7:
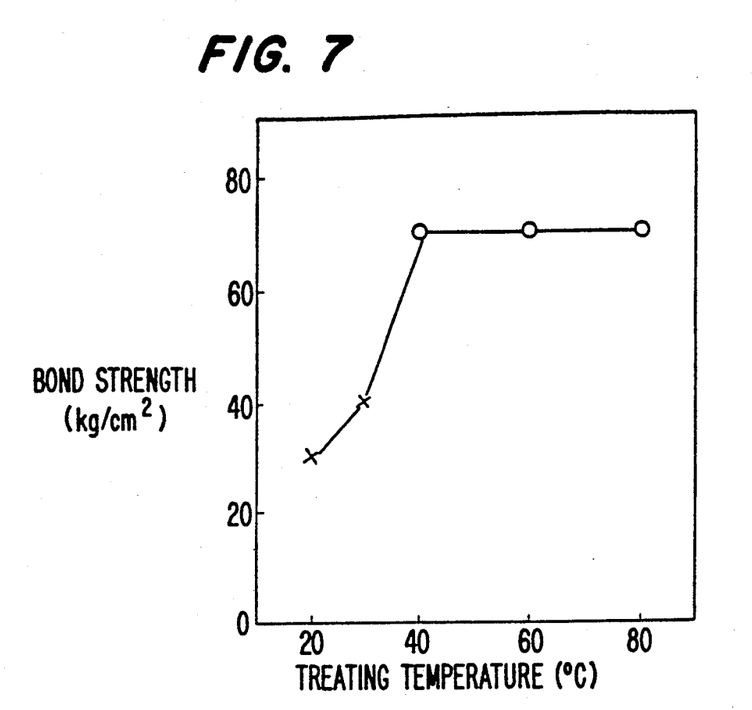

The test piece was heated to a predetermined temperature for 10 minutes, and the photo-curable resin was cured under the same conditions as in EXAMPLE 4. The test piece thus obtained was subjected to a tensile test at 20° C., to obtain the results as shown in FIG. 7. The test piece was cut, and the cross-section was observed under a microscope. Infiltration of the adhesion promotor contained in the photo-curable resin into the transparent plate was observed, as shown in FIG. 8.

When the heating temperature exceeds 30° C., the infiltration of the adhesion promotor into the transparent plate is accelerated, and the breaking condition of the test piece at the time of the adhesion test shifts from interfacial separation (marked X) to cohesive failure (marked O) accordingly. Thus, the bond strength between the transparent plate and the photo-cured resin is remarkably enhanced.

EXAMPLE 6

As illustrated in FIG. 3, a transparent plate 1 of polymethyl methacrylate, 970×740×3 mm, and a 10 mm-thick brass-made Fresnel pattern forming matrix 2 equal in area to the transparent plate, were prepared, and the matrix 2 was heated to 60° C. A replica-forming photo-curable resin 9 with an adhesion promotor added thereto, as designated B in TABLE 1, was poured into the gap between the transparent plate 1 and the matrix 2 in a thickness of about 200 μm, and was left to stand for 10 minutes. After an infiltrated layer 7 of the adhesion promotor was formed at the surface of the transparent plate 1, irradiation with light (for 30 minutes with a light intensity of 50 mW/cm$^2$ at a wavelength of 365 nm) was conducted by use of a high pressure mercury vapor lamp 4 disposed on the side of the transparent plate 1 to cure simultaneously the infiltrated layer 7 and the replica-forming photo-curable resin 9. Next, the matrix 2 was released, to obtain a Fresnel plate as a replica plate 10.

On the other hand, an attempt was made to produce a replica plate 10 in the same manner as above except that the matrix 2 was not heated (20° C.). As a result, the infiltrated layer 7 was not formed, and hence delamination between the transparent plate 1 and the photo-cured resin 9 occurred. Thus, it was impossible to obtain a favorable Fresnel plate.

EXAMPLE 7

Replica-forming photo-curable resins with adhesion promotors added thereto, designated B, C and E to L in TABLE 1, were prepared.

The transparent plastic plates, replica-forming photo-curable resins and heating treatment conditions were selected as shown in TABLE 3, and replica plates were formed in the same procedure as in EXAMPLE 6.

TABLE 3

| Classification | No. | Transparent Plastic Plate | Replica-forming Photo-curable Resin | Heat Treatment | Bond** Strength (kg/cm$^2$) | Condition of Replica |
| --- | --- | --- | --- | --- | --- | --- |
| Comparative Example | 2-1 (1-2) | Methyl methacrylate/styrene | B | no treatment (25° C., 10 min) | 30 | bad |

TABLE 3-continued

| Classification | No. | Transparent Plastic Plate | Replica-forming Photo-curable Resin | Heat Treatment | Bond** Strength (kg/cm$^2$) | Condition of Replica |
|---|---|---|---|---|---|---|
| | 2-2 (1-3) | copolymer (styrene: 40 wt. %) | C | no treatment (25° C., 10 min) | 15 | " |
| | 2-3 | | E | no treatment (25° C., 10 min) | 30 | " |
| | 4 | | F | no treatment (25° C., 10 min) | 20 | " |
| | 5 | | G | no treatment (25° C., 10 min) | 15 | " |
| | 6 | | H | no treatment (25° C., 10 min) | 15 | " |
| | 7 | | I | no treatment (25° C., 10 min) | 15 | " |
| | 8 | | J | no treatment (25° C., 10 min) | 20 | " |
| | 9 | | K | no treatment (25° C., 10 min) | 15 | " |
| | 10 | | L | no treatment (25° C., 10 min) | 10 | " |
| | 11 | Polymethyl methacrylate | B | no treatment (25° C., 10 min) | 30 | " |
| | 12 | Polystyrene | B | no treatment (25° C., 10 min) | 30 | " |
| | 13 | Polycarbonate | B | no treatment (25° C., 10 min) | 30 | " |
| | 14 | Cellulose diacetate | B | no treatment (25° C., 10 min) | 30 | " |
| Example | 2-1 | Methyl methacrylate/styrene | B | 60° C., 10 min | 70 or above | normal |
| | 2 | copolymer | C | " | 70 or above | " |
| | 3 | (styrene: 40 wt. %) | E | " | 70 or above | " |
| | 4 | | F | " | 70 or above | " |
| | 5 | | G | " | 70 or above | " |
| | 6 | | H | " | 70 or above | " |
| | 7 | | I | " | 70 or above | " |
| | 8 | | J | " | 70 or above | " |
| | 9 | | K | " | 70 or above | " |
| | 10 | | L | " | 70 or above | " |
| | 11 | Polymethyl methacrylate | B | " | 70 or above | " |
| | 12 | Polystyrene | B | " | 70 or above | " |
| | 13 | Polycarbonate | B | " | 70 or above | " |
| | 14 | Cellulose diacetate | B | " | 70 or above | " |

Note:
**Bond strength between transparent plastic plate and replica-forming photo-curable resin.

In each of EXAMPLES 2-1 to 2-14 in which the matrix heated to 60° C. was used and the transparent plastic plate and the liquid photo-curable resin were subjected to a 10 minute heat treatment, the bond strength between the transparent plastic plate and the photo-curable resin was 70 kg/cm$^2$ or above, and useable replica plates were obtained.

On the other hand, in each of COMPARATIVE EXAMPLES 2-1 to 2-14 in which the heat treatment was not applied, the bond strength between the transparent plastic plate and the photo-cured resin was insufficient, namely 30 kg/cm$^2$ or below. In these cases, all the replica plates obtained were rejectable due to partial delamination of the transparent plate and the photo-cured resin from each other or adhesion of the resin to the matrix.

EXAMPLE 8

All of the Fresnel plates obtained in EXAMPLE 2, EXAMPLES 1-2 and 1-3 in EXAMPLE 3, EXAMPLE 6, and EXAMPLES 2-1 to 2-9 and 2-11 in EXAMPLE 7, had an area of 970×740 mm, a thickness of transparent plate of 3 mm, a thickness of photo-curable resin layer of about 200 μm, and a refractive index of photo-cured resin portion in the range of 1.55 to 1.57.

The Fresnel plates had a warpage of within 0.1 mm per 100 mm of plate width, and the surfaces of the Fresnel plates had a sawtooth-shaped cross-section with a Fresnel pitch of 0.11 mm transferred accurately from the matrix. When the focal distance on the input side of the Fresnel plates was 859 mm, the focal distance on the output side was about 9800 mm, and, where the same photo-cured resin was used, it was possible to maintain the dispersion of the output-side focal distance within 10%.

Figure 9A:
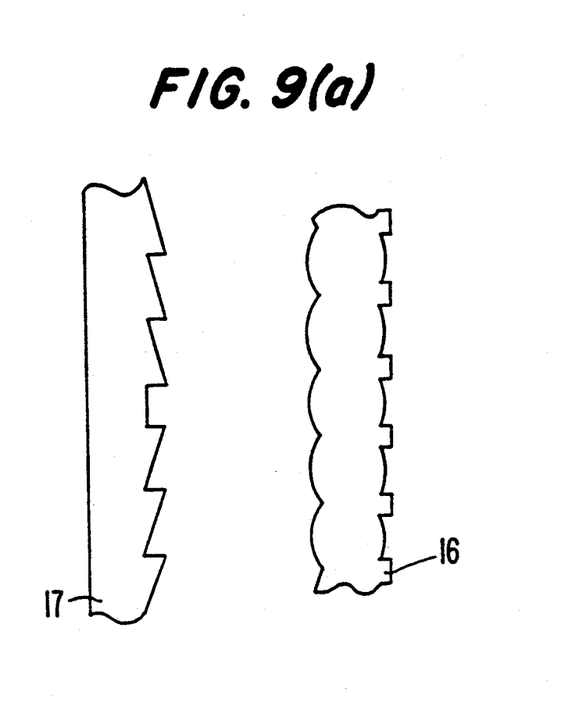
Figure 9B:
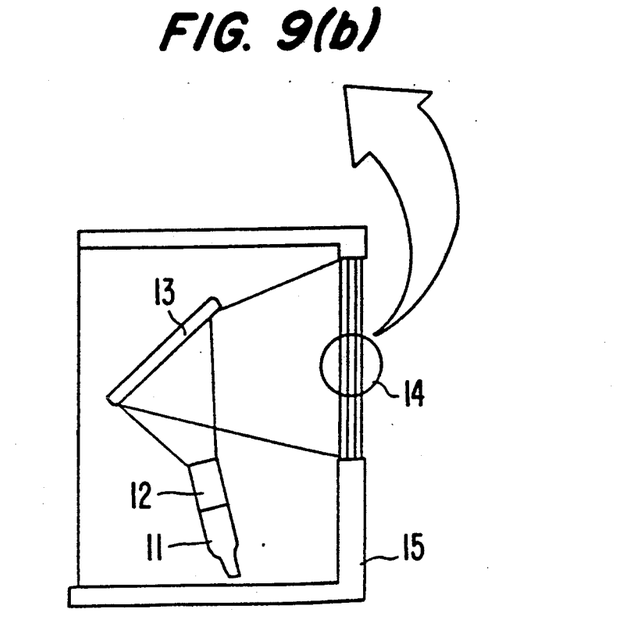
FIG. 9(b) is a view illustrating a projection type television to which a Fresnel plate according to the present invention is applied, FIG. 9(a) being an enlarged view of a part of FIG. (b).

As shown in FIGS. 9(a) and 9(b), a projection type television set 15 comprising a light emitting tube 11, a lens 12, a mirror 13 and a screen 14 was prepared. Of the screen 14, a front panel 16 is preliminarily prepared, and the Fresnel plate 17 was constituted of each of the Fresnel plates produced in the above EXAMPLES. Practical operation tests on the projection type television set were carried out, and there was no color mis-convergence or image distortion observed; thus, it was confirmed that the Fresnel plate according to this invention is capable of showing satisfactory performance when put to practical use. Moreover, the projection type television set showed no abnormality in images even after being left to stand for 1,000 hours under the conditions of 40° C. and 95% RH.

In view of the materials and processing techniques disclosed in connection with the present invention, the present invention has particular applicability to Fresnel screens. Moreover, utilizing a methacrylate-styrene copolymer as a material of the transparent plastic plate according to the present invention is advantageous in heat resistance and light resistance, as compared to other materials, such as polyvinylc chloride/vinylacetate, celluloseacetate, celluloseacetobutyrate, etc., used in other techniques for providing a configured resin layer on a substrate. Thus, the methacrylate-styrene copolymer is particularly useful as a material of the transparent plastic substrate of a Fresnel screen, according to the present invention.

In forming a Fresnel screen, the desired method of application of the adhesion promotor is spraying, due to the relatively large size of the Fresnel screen (for example, 970 mm × 740 mm square). Such spraying method is more appropriate than, for example, dipping the transparent plastic plate into the adhesion promotor, due to the relatively large reservoir that would be necessary for such dipping.

In addition, according to the present invention, it is desired that the adhesion promotor have a boiling point not lower than 130° C., in order to avoid evaporation or odor from the adhesion promotor, so as to maintain a safe operation of the procedure.

As has been described hereinabove, according to this invention a layer infiltrated with an adhesion promotor is provided at the surface of a transparent plastic plate, whereby it is possible to enhance the adhesion between the surface of the transparent plastic plate and a photo-cured resin in contact therewith; and to produce a replica plate having excellent optical characteristics, good replicating properties and high reliability. This invention has contribution to enhancement of the performance of projection type screens for televisions, optical parts such as lenses, products associated with optical disks, and so on.

While we have shown and described several embodiments in accordance with the present invention, it is understood that the same is not limited thereto but is susceptible of numerous changes and modifications as known to one having ordinary skill in the art, and we therefore do not wish to be limited to the details shown and described herein, but intend to cover all such modifications as are encompassed by the scope of the appended claims.

What is claimed:

1. A replica plate comprising;
   a transparent plastic plate;
   an infiltrated layer provided on the transparent plastic plate, the infiltrated layer comprising a liquid acrylic or methacrylic compound having a boiling point of not lower than 130° C., infiltrated into material of the transparent plastic plate; and
   an acrylic or methacrylic replica-forming photo-cured resin layer provided on the infiltrated layer comprising the acrylic or methacrylic compound, the photo-cured resin layer having recessed portions and projected portions at a surface thereof.

2. The replica plate as set forth in claim 1, wherein the transparent plastic plate is made of a material selected from the group consisting of polymethyl methacrylate, polyethyl methacrylate, polystyrene, a methyl methacrylate-styrene copolymer, a styrene-acrylonitrile copolymer, a styrene-butadiene copolymer, a styrene-isoprene copolymer, polycarbonate, cellulose acetate, cellulose acetate butyrate and polyvinyl chloride.

3. The replica plate as set forth in claim 1, wherein the acrylic or methacrylic compound is selected from the group consisting of benzyl acrylate, benzyl methacrylate, phenyl acrylate, phenyl methacrylate, 2-phenoxyethyl acrylate, 2-phenoxyethyl methacrylate, 2-phenoxypropyl acrylate, 2-phenoxypropyl methacrylate, neopentylglycoldiacrylate, neopentylglycoldimethacrylate, 1,6-hexanedioldiacrylate, and 1,6-hexanedioldimethacrylate.

4. The replica plate as set forth in claim 1, wherein the transparent plastic plate is formed of material comprising a methyl methacrylate-styrene copolymer, and the liquid acrylic or methacrylic compound comprises at least one selected from the group consisting of benzyl acrylate and benzyl methacrylate.

5. The replica plate as set forth in claim 1, wherein the acrylic or methacrylic replica-forming photo-cured resin layer includes the acrylic or methacrylic compound incorporated therein.

6. The replica plate as set forth in claim 1, wherein the infiltrated layer has a thickness of 5–170 μm.

7. A process for producing a replica plate, comprising:
   disposing an acrylic or methacrylic replica-forming photo-curable resin between a transparent plastic plate and a matrix having recessed portions and projected portions at a surface thereof;
   curing the photo-curable resin; and
   releasing the cured photo-curable resin and the matrix from each other, wherein a surface of the transparent plastic plate to be closest to the photo-curable resin, prior to said curing, is contacted with a liquid acrylic or methacrylic compound having a boiling point of not lower than 130° C. and capable of infiltrating the plastic plate, so as to enhance adhesion between the plastic plate and the cured resin as compared to adhesion between the plastic plate and cured resin without the contact with the liquid acrylic or methacrylic compound.

8. The process as set forth in claim 7, wherein, prior to said disposing, a surface of the transparent plastic plate to be closest to the photo-curable resin is coated with the liquid acrylic or methacrylic compound having the boiling point of not lower than 13020 C. and capable of infiltrating the plastic plate.

9. The process as set forth in claim 8, wherein said surface of the transparent plastic plate is coated with the acrylic or methacrylic compound so as to form a coating of the compound having a thickness of 0.5 to 30 μm.

10. The process as set forth in claim 7, wherein the liquid acrylic or methacrylic compound having the boiling point of not lower than 130° C. and capable of infiltrating the transparent resin plate is added to the photo-curable resin, and contacts the transparent plastic plate when the photo-curable resin is disposed on the transparent plastic plate.

11. The process as set forth in claim 10, wherein the liquid acrylic or methacrylic compound having the boiling point of not lower than 130° C. and capable of dissolving the transparent plate is added to the photo-curable resin, and after the disposing the photo-curable resin on the plastic plate, the photo-curable resin and the plastic plate are heated in contact, whereby the acrylic or methacrylic compound infiltrates the plastic plate.

12. The process as set forth in claim 7, wherein the transparent plastic plate is made of a material selected from the group consisting of polymethyl methacrylate, polyethyl methacrylate, polystyrene, a methyl methacrylate-styrene copolymer, a styrene-acrylonitrile copolymer, a styrene-butadiene copolymer, a styrene-isoprene copolymer, polycarbonate, cellulose acetate, cellulose acetate butyrate, and polyvinylchloride.

13. The process as set forth in claim 7, wherein the liquid acrylic or methacrylic compound having a boiling point of not lower than 130° C. and capable of infiltrating the plastic plate is selected from the group consisting of benzyl acrylate, benzyl methacrylate, phenyl acrylate, phenyl methacrylate, 2-phenoxyethyl acrylate, 2-phenoxyethyl methacrylate, 2-phenoxypropyl acrylate, 2-phenoxypropyl methacrylate, neopentyl glycoldiacrylate, neopentylglycoldimethacrylate, 1,6-hexanedioldiacrylate, and 1,6-hexanedioldimethacrylate.

14. The process as set forth in claim 7, wherein the transparent plastic plate is formed of material comprising a methyl methracrylate-styrene copolymer, and the liquid acrylic or methacrylic compound comprises at least one selected from the group consisting of benzyl acrylate and benzyl methacrylate.

15. The process as set forth in claim 7, wherein the liquid acrylic or methacrylic compound infiltrates a surface layer of the transparent plastic plate so as to swell said surface layer.

16. Product formed by the process of claim 7.

17. A replica plate comprising:
a transparent plastic plate;
an infiltrated layer provided on the transparent plastic plate, the infiltrated layer comprising a liquid acrylic or methacrylic compound having a boiling point of not lower than 130° C., infiltrated into material of the transparent plastic plate, the infiltrated layer being formed from a surface layer of a precursor transparent plastic plate including said transparent plastic plate and said material of the transparent plastic plate into which the liquid acrylic or methacrylic compound infiltrates, the infiltrated layer being a swollen layer as compared to the surface layer of the precursor transparent plastic plate; and
an acrylic or methacrylic replica-forming photo cured resin layer provided on the infiltrated layer comprising the acrylic or methacrylic compound, the photo-cured resin layer having recessed portions and projected portions at a surface thereof.

18. The replica plate as set forth in claim 17, having a surface profile so as to function as an optical lens.

19. The replica plate as set forth in claim 17, having a surface profile so as to function as a Fresnel lens.

20. The replica plate as set forth in claim 17, having a peripheral shape so as to be capable of functioning as a projection screen for a television.

21. A projection television including the projection screen as set forth in claim 20.

* * * * *